(12) United States Patent
Oyama et al.

(10) Patent No.: US 12,724,079 B2
(45) Date of Patent: Sep. 1, 2026

(54) BATTERY DIAGNOSIS APPARATUS

(71) Applicant: SUBARU CORPORATION, Tokyo (JP)

(72) Inventors: Noboru Oyama, Tokyo (JP); Shuichiro Yamaguchi, Tokyo (JP); Yasuhiko Ohsawa, Tokyo (JP); Yasumasa Mochizuki, Tokyo (JP); Rin Furudate, Tokyo (JP); Hiroshi Abe, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 394 days.

(21) Appl. No.: 18/564,582

(22) PCT Filed: Jul. 14, 2022

(86) PCT No.: PCT/JP2022/027721
§ 371 (c)(1),
(2) Date: Nov. 27, 2023

(87) PCT Pub. No.: WO2024/013938
PCT Pub. Date: Jan. 18, 2024

(65) Prior Publication Data
US 2025/0085353 A1 Mar. 13, 2025

(51) Int. Cl.
*G01R 31/3842* (2019.01)
*G01R 31/378* (2019.01)
(Continued)

(52) U.S. Cl.
CPC ....... *G01R 31/3842* (2019.01); *G01R 31/378* (2019.01); *G01R 31/392* (2019.01); *H01M 10/4285* (2013.01)

(58) Field of Classification Search
CPC .............. G01R 31/3842; G01R 31/378; G01R 31/392; G01R 31/36; G01R 31/389;
(Continued)

(56) References Cited

U.S. PATENT DOCUMENTS 8,823,321 B2 * 9/2014 Dvorkin ................. G01K 13/00 320/113
11,422,194 B2 8/2022 Oyama et al.
(Continued)

FOREIGN PATENT DOCUMENTS

JP H11-326471 A 11/1999
JP 2002-044880 A 2/2002
(Continued)

OTHER PUBLICATIONS

S. Taniguchi, K. Adachi and Y. Tanaka, "A method for identifying the full charging point and the degree of deterioration of lead-acid batteries," INTELEC. Twenty-Second International Telecommunications Energy Conference (Sep. 10, 2000), pp. 609-614, doi: 10.1109/INTELEC.2000.884311.
(Continued)

*Primary Examiner* — Mohammad K Islam
(74) *Attorney, Agent, or Firm* — Rimon P.C.

(57) ABSTRACT

A battery diagnosis apparatus includes a current source configured to apply a pulse current to a battery, a voltage sensor configured to detect a voltage between terminals of the battery, and a control device. The control device includes one or more processors and one or more memories coupled to the one or more processors. The one or more processors are configured to execute processing including acquiring a voltage response obtained by applying the pulse current from the current source to the battery; deriving, based on the voltage response, an index indicating a comparison between an on-ATRF and an off-ATRF, the on-ATRF being an apparent transient resistance function of the battery when the pulse current is turned on, the off-ATRF being an apparent transient resistance function of the battery when the pulse current is turned off; and determining a degree of deposition of lithium in the battery, based on the derived.

8 Claims, 6 Drawing Sheets

(51) Int. Cl.
*G01R 31/392* (2019.01)
*H01M 10/42* (2006.01)

(58) Field of Classification Search
CPC ........... H01M 10/4285; H01M 10/425; H01M 10/48; H01M 10/052; Y02E 60/10
See application file for complete search history.

(56) References Cited

U.S. PATENT DOCUMENTS

| | | | | |
|---|---|---|---|---|
| 2014/0367270 | A1* | 12/2014 | Williamson | C25B 15/02<br>205/337 |
| 2016/0028130 | A1* | 1/2016 | Dvorkin | G01R 31/378<br>320/152 |
| 2017/0082693 | A1 | 3/2017 | Leidich | |
| 2020/0002812 | A1* | 1/2020 | Lee | C23C 16/045 |
| 2020/0076010 | A1* | 3/2020 | Taylor | H01M 10/44 |
| 2021/0382114 | A1* | 12/2021 | Oyama | G01R 31/388 |

FOREIGN PATENT DOCUMENTS

| | | | |
|---|---|---|---|
| JP | 2021-077570 | A | 5/2021 |
| JP | 6991616 | B2 | 1/2022 |
| WO | 2020/090143 | A1 | 5/2020 |

OTHER PUBLICATIONS

S. Taniguchi, Y. Yamaguchi, K. Harada, "A method for identifying the full charging point and the degree of deterioration of lead-acid batteries," The Transactions of the Institute of Electronics, Information and Communication Engineers B (Nov. 1, 2002), vol. J85B, No. 11, pp. 1952-1963, ISSN: 1344-4697. Concise explanation of relevance is "A" indication in the International Search Report.

International Search Report received in PCT Application No. PCT/JP2022/027721, dated Oct. 4, 2022.

English Translation of International Search Report received in PCT Application No. PCT/JP2022/027721, dated Oct. 4, 2022.

* cited by examiner

FIG. 1

| AVERAGE RESISTANCE FUNCTION RATIO (A) | SLDT |
|---|---|
| A>0. 90 | 0 |
| 0. 90≧A>0. 75 | 1 |
| 0. 75≧A>0. 70 | 2 |
| 0. 70≧A>0. 65 | 3 |
| 0. 65≧A>0. 60 | 4 |
| 0. 60≧A | 5 |

FIG. 7

BATTERY DIAGNOSIS APPARATUS

CROSS-REFERENCE TO RELATED APPLICATIONS

This application is the U.S. National Phase under 35 U.S.C. § 371 of International Application No. PCT/JP2022/027721, filed on Jul. 14, 2022.

TECHNICAL FIELD

The present invention relates to a battery diagnosis apparatus for diagnosing a state of a battery.

BACKGROUND ART

For example, PTL 1 discloses a battery diagnosis apparatus for determining a degree of degradation of a battery. Such a battery diagnosis apparatus acquires a resistance value from a current and a voltage measured when a pulse current is applied to the battery and determines the degree of degradation of the battery from the resistance value.

CITATION LIST

Patent Literature

PTL 1: Japanese Patent No. 6991616

SUMMARY OF INVENTION

Technical Problem

For example, a lithium ion battery exhibits a phenomenon in which lithium is gradually deposited on a negative electrode. The deposition of lithium may accelerate degradation and in some cases cause thermal runaway of the battery. Detection of such deposition of lithium involves disassembling the battery and visually check the deposition of lithium. Determination of the degree of degradation such as the deposition of lithium takes much time, labor, and cost.

Accordingly, it is an object of the present invention to provide a battery diagnosis apparatus capable of easily diagnosing degradation of a battery.

Solution to Problem

To solve the above-described problem, a battery diagnosis apparatus according to an embodiment of the present invention is a battery diagnosis apparatus for diagnosing a state of a battery, including:

a current source configured to apply a pulse current to the battery;

a voltage sensor configured to detect a voltage between terminals of the battery; and a control device.

The control device includes:

one or more processors; and one or more memories coupled to the one or more processors.

The one or more processors are configured to execute processing including:

acquiring a voltage response obtained by applying the pulse current from the current source to the battery;

deriving, based on the voltage response, an index indicating a comparison between an on-ATRF and an off-ATRF, the on-ATRF being an apparent transient resistance function of the battery when the pulse current is turned on, the off-ATRF being an apparent transient resistance function of the battery when the pulse current is turned off; and determining a degree of deposition of lithium in the battery, based on the derived index.

Advantageous Effects of Invention

According to the present invention, it is possible to easily diagnose degradation of a battery.

BRIEF DESCRIPTION OF DRAWINGS

FIG. 1 is a schematic diagram illustrating a configuration of a battery diagnosis system according to the present embodiment.

FIG. 7 is a flowchart illustrating a process flow in a battery diagnosis apparatus.

DESCRIPTION OF EMBODIMENTS

Figure 2:
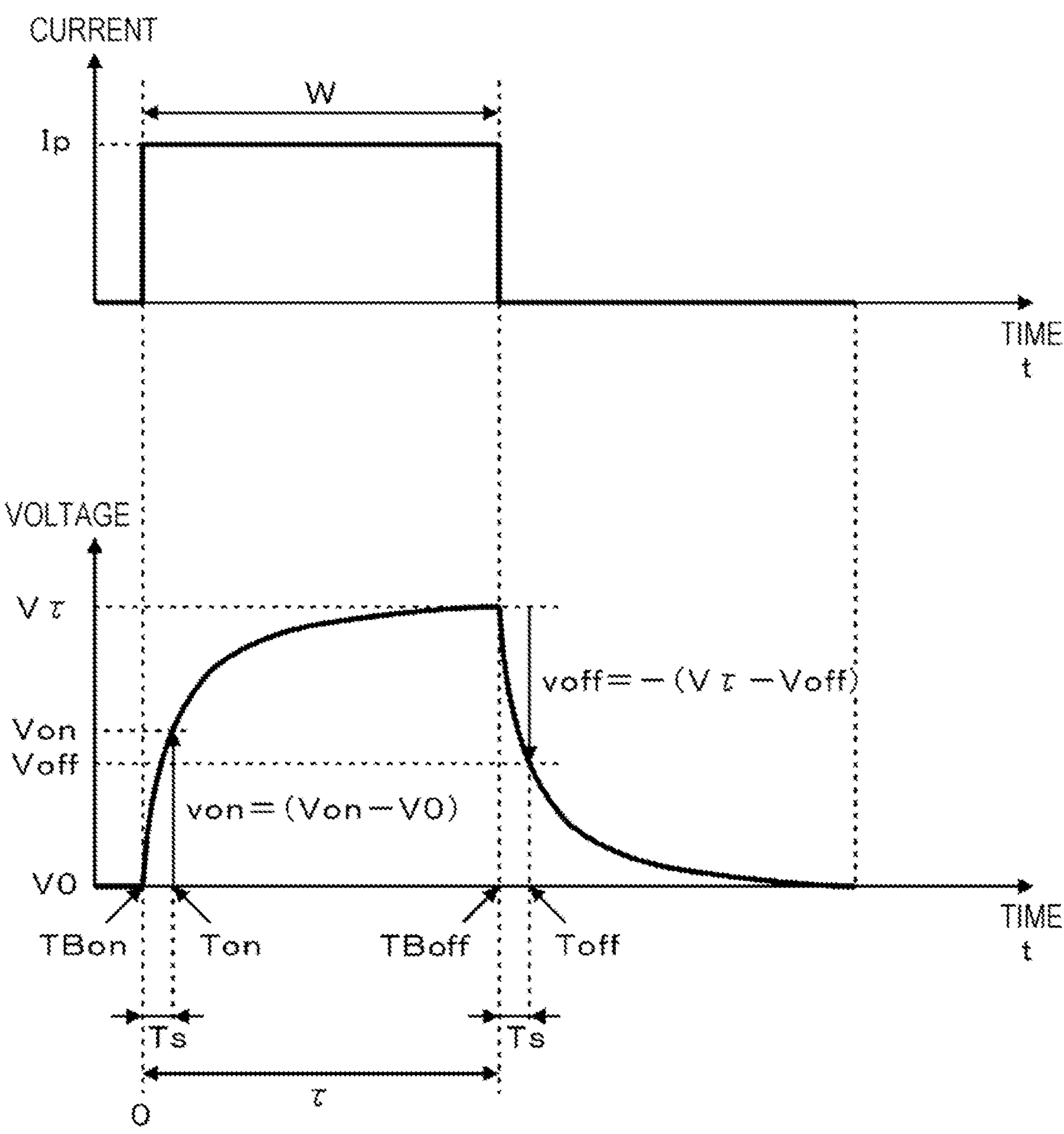
FIG. 2 is a diagram illustrating an example of a pulse current and a voltage response when substantially no lithium is deposited.

Hereinafter, an embodiment of the present invention will be described in detail with reference to the accompanying drawings. Specific dimensions, materials, numerical values, and the like illustrated in the embodiment are merely examples for facilitating understanding of the invention, and do not limit the present invention unless otherwise specified. In this specification and the drawings, elements having substantially the same functions and configurations are denoted by the same reference numerals, and redundant description thereof will be omitted. In addition, elements that are not directly related to the present invention will not be illustrated in the drawings.

Figure 1:
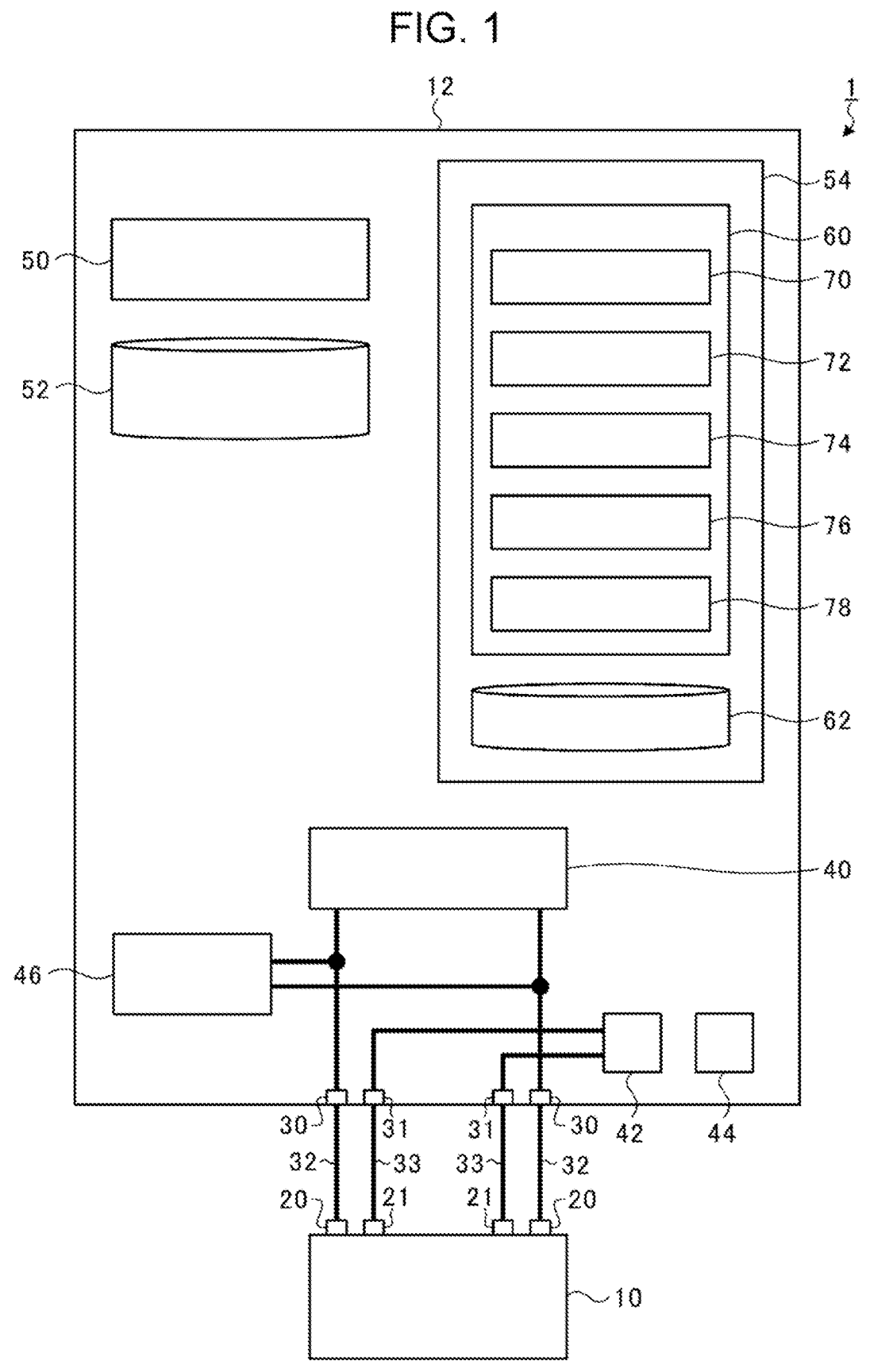

FIG. 1 is a schematic diagram illustrating a configuration of a battery diagnosis system 1 according to the present embodiment. The battery diagnosis system 1 includes a battery 10 and a battery diagnosis apparatus 12.

The battery 10 is, for example, a lithium ion battery. For example, but not limitation, the battery 10 is mounted and used on an electric vehicle or a hybrid electric vehicle. The battery 10 may be used on any electric device or the like.

The battery 10 includes two current terminals 20 and two voltage terminals 21. A first current terminal in the two current terminals 20 and a first voltage terminal in the two voltage terminals 21 of the battery 10 are coupled to a positive electrode of the battery 10. A second current terminal in the two current terminals 20 and a second voltage terminal in the two voltage terminals 21 of the battery 10 are coupled to a negative electrode of the battery 10.

If lithium is deposited on a negative electrode of a lithium ion battery, the deposited lithium prevents lithium ions in the solution from moving into a graphite layer of the negative electrode or induces a side reaction on the surface of the graphite layer. As a result, the performance of the lithium ion battery deteriorates. That is, the more the amount of lithium to be deposited is, the more the degradation of the battery 10 progresses.

The battery diagnosis apparatus 12 is an apparatus for diagnosing a state such as a degree of degradation of the battery 10. To be more specific, the battery diagnosis apparatus 12 diagnoses the degree of deposition of lithium. For example, the battery diagnosis apparatus 12 is not mounted on a vehicle on which the battery 10 is mounted, and is managed by a mechanic who repairs or inspects the vehicle. The battery diagnosis apparatus 12 may be mounted on a vehicle on which the battery 10 is mounted.

The battery diagnosis apparatus 12 includes two external current terminals 30, two external voltage terminals 31, two current cables 32, and two voltage cables 33. A first current cable in the two current cables 32 is coupled to a first external current terminal in the two external current terminals 30. An end of the first current cable farther away from the first external current terminal can be electrically coupled to the first current terminal in the two current terminals 20 of the battery 10. A second current cable in the two current cables 32 is coupled to a second external current terminal in the two external current terminals 30. An end of the second current cable farther away from the second external current terminal can be electrically coupled to the second current terminal in the two current terminals 20 of the battery 10. A first voltage cable in the two voltage cables 33 is coupled to a first external voltage terminal in the two external voltage terminals 31. An end of the first voltage cable farther away from the first external voltage terminal can be electrically coupled to the first voltage terminal in the two voltage terminals 21 of the battery 10. A second voltage cable in the two voltage cables 33 is coupled to a second external voltage terminal in the two external voltage terminals 31. An end of the second voltage cable farther away from the second external voltage terminal can be electrically coupled to the second voltage terminal in the two voltage terminals 21 of the battery 10. If the battery 10 is a battery not including the voltage terminals 21, the voltage terminals 21 may be coupled to the same terminals as the current terminals 20. In this mode, the voltage terminals 21 are coupled to portions closer to the battery 10 than the current terminals 20, thereby achieving measurement accuracy whose degree is equivalent to that for the battery 10 including both the current terminals 20 and the voltage terminals 21.

The battery diagnosis apparatus 12 includes a current source 40, a voltage sensor 42, a temperature sensor 44, and an SOC adjustment device 46. The SOC (State Of Charge) indicates a charging rate that is the ratio of the present charging capacity to the full charging capacity of the battery 10 and that is expressed in percentage.

The current source 40 is electrically coupled to the two external current terminals 30. The current source 40 is configured to be capable of generating a pulse current that is a pulsed current. The current source 40 is also configured to be capable of changing the current value of the pulse current to be generated.

The current source 40 is capable of applying a pulse current to the battery 10 when the external current terminals 30 remain electrically coupled to the current terminals 20 of the battery 10 through the current cables 32.

The voltage sensor 42 is electrically coupled to the two external voltage terminals 31. The voltage sensor 42 detects a voltage between the two external voltage terminals 31. That is, when the external voltage terminals 31 remain electrically coupled to the voltage terminals 21 of the battery 10 through the voltage cables 33, the voltage sensor 42 detects a voltage between the voltage terminals 21 of the battery 10. In the following description, the expression "the external current terminals 30 are electrically coupled to the current terminals 20 of the battery 10 through the current cables 32 and the external voltage terminals 31 are electrically coupled to the voltage terminals 21 of the battery 10 through the voltage cables 33" may be referred to as the expression "the battery diagnosis apparatus 12 is coupled to the battery 10", for convenience of description.

The temperature sensor 44 detects the temperature of the battery 10. For example, the temperature sensor 44 may be in contact with the battery 10 or may be disposed in close proximity to the battery 10 to appropriately detect the temperature of the battery 10.

The SOC adjustment device 46 is electrically coupled between the two external current terminals 30. The SOC adjustment device 46 is configured to be capable of receiving electric power output from the battery 10 while the battery diagnosis apparatus 12 remains coupled to the battery 10. The SOC adjustment device 46 is also configured to be capable of supplying electric power to the battery 10 while the battery diagnosis apparatus 12 remains coupled to the battery 10.

That is, the SOC adjustment device 46 is capable of discharging the battery 10 to intentionally reduce the SOC, and is also capable of charging the battery 10 to intentionally increase the SOC. The SOC adjustment device 46 may be any electric device capable of charging and discharging the battery 10, such as a motor generator or a battery different from the battery 10. For example, the SOC adjustment device 46 may be implemented as a combination of an electric device capable of discharging the battery 10 and an electric device capable of charging the battery 10.

The battery diagnosis apparatus 12 includes an input/output device 50, a storage device 52, and a control device 54. The input/output device 50 includes an input device that receives an input operation of a user. Examples of the input device include a keyboard, a mouse, and a touch panel. The input/output device 50 also includes an output device that presents various kinds of information to a user. Examples of the output device include a display device that displays a diagnosis result.

The storage device 52 is implemented as a nonvolatile storage element such as a hard disk drive or a flash memory. The storage device 52 may store a diagnosis result or the like.

The control device 54 includes one or more processors 60 and one or more memories 62 coupled to the processor (or processors) 60. The memory (or memories) 62 includes a ROM that stores programs and the like, and a RAM serving as a work area. The processor (or processors) 60 controls the entire battery diagnosis apparatus 12 in accordance with a program included in the memory (or memories) 62.

The processor (or processors) 60 executes a program to also serve as a voltage response acquirer 70, an index deriver 72, a determiner 74, a determination criterion setter 76, and an SOC adjuster 78. In the following description, it is assumed that the battery diagnosis apparatus 12 has been coupled to the battery 10.

The voltage response acquirer 70 causes the current source 40 to apply one pulse current to the battery 10. In response to a pulse current being applied to the battery 10, a voltage is generated between the voltage terminals 21 of the battery 10. The voltage sensor 42 detects the voltage between the voltage terminals 21 of the battery 10. Such a voltage obtained by application of a pulse current may be hereinafter referred to as a voltage response. The voltage response acquirer 70 acquires the voltage response detected by the voltage sensor 42.

FIG. 2 is a diagram illustrating an example of a pulse current and a voltage response when substantially no lithium is deposited. In FIG. 2, the time "t" of the pulse width "W" is set to, for example, 10 seconds or the like. However, the time "t" of the pulse width "W" may be set to any time. The symbol "Ip" indicates a current value of the pulse current.

The symbol "TBon" indicates a rising start timing of the pulse current, that is, the timing of a rising edge of the pulse current. The symbol "TBoff" indicates a falling start timing of the pulse current, that is, the timing of a falling edge of the pulse current. The time "τ" indicates an application time of the pulse current when the rising start timing "TBon" of the pulse current is set to 0. The time "t" indicates a certain time when the rising start timing "TBon" of the pulse current is set to 0.

When substantially no lithium is deposited, the time taken for the voltage to decrease in response to turning off of the pulse current is approximately the same as the time taken for the voltage to increase in response to turning on of the pulse current.

The symbol "Ton" indicates a timing at which a specific time "Ts" has elapsed from the timing "TBon" of a rising edge of the pulse current. The symbol "Toff" indicates a timing at which a specific time "Ts" has elapsed from the timing "TBoff" of a falling edge of the pulse current. In other words, the timing "Toff" is obtained by adding the specific time "Ts" to the time "τ" measured with reference to the timing "TBon". It is assumed that the specific time "Ts" between the timings "TBon" and "Ton" and the specific time "Ts" between the timings "TBoff" and "Toff" are substantially the same.

When the timing at which the certain time "t" has elapsed from the timing "TBon" is "Ton", the specific time "Ts" between the timings "TBon" and "Ton" is the same as the time "t". When the timing at which the certain time "t" has elapsed from the timing "TBon" is "Toff", the specific time "Ts" between the timings "TBoff" and "Toff" is the same as the time "t–τ".

The symbol "V0" indicates an open-circuit voltage value of the battery 10. It is assumed here that the voltage value at the rising start timing "TBon" of the pulse current is "V0". The symbol "Von" indicates a voltage value detected by the voltage sensor 42 at the timing "Ton". The symbol "Vτ" indicates a voltage value detected by the voltage sensor 42 at the falling start timing "TBoff" of the pulse current. The symbol "Voff" indicates a voltage value detected by the voltage sensor 42 at the timing "Toff".

The current value of the pulse current and the voltage response obtained by application of the pulse current can be used to calculate an apparent transient resistance function (ATRF). The ATRE is a function indicating a temporal change in apparent transient resistance value in response to turning on/off of the pulse current.

The value "von" indicating a voltage response obtained when the pulse current is turned on can be defined as given in Equation (1) below.

$$von = \mathrm{Von} - \mathrm{V0} \tag{1}$$

That is, the value "von" is obtained by subtracting the open-circuit voltage value "V0" at the timing "TBon" from a voltage value at the timing at which the certain time "t" has elapsed from the timing "TBon", for example, the voltage value "Von" at the timing "Ton" at which the specific time "Ts" has elapsed from the timing "TBon". The value "von" differs depending on the certain time "t" or the specific time "Ts" from the timing "TBon".

The ATRE based on the voltage response obtained when the pulse current is turned on may be referred to as an on-ATRF. The on-ATRF may be represented by "ATRFon (t)".

As given in Equation (2) below, the on-ATRE "ATRFon (t)" is derived by dividing the voltage response "von" obtained when the pulse current is turned on by the current value "Ip" of the pulse current.

$$ATRFon\,(t) = von/Ip \tag{2}$$

As described above, since the value "von" differs depending on the certain time "t" from the timing "TBon", ATRFon (t) differs depending on the time "t" and is a function whose variable is the time "t". Since the specific time "Ts" between the timings "TBon" and "Ton" corresponds to the time "t", ATRFon(t) can be said to be a function whose variable is the specific time "Ts" between the timings "TBon" and "Ton".

The value "voff" indicating a voltage response obtained when the pulse current is turned off can be defined as given in Equation (3) below.

$$voff = -(\mathrm{V}_\tau - \mathrm{Voff}) \tag{3}$$

As described above, the specific time "Ts" between the timings "TBoff" and "Toff" can be expressed by "t–τ" by using the certain time "t" and the application time "τ" of the pulse current. The value "Vτ–Voff" is a difference value obtained by subtracting the voltage value at the time "t–τ", for example, the value "Voff", from the voltage value "Vτ" at the timing "TBoff". That is, the value "voff" is a voltage value that is minus the difference value. The value "voff" differs depending on the certain time "t" from the timing "TBon" or the specific time "Ts".

The ATRE based on the voltage response obtained when the pulse current is turned off may be referred to as an off-ATRF. The off-ATRF may be represented by "ATRFoff (t–τ)".

As given in Equation (4) below, the off-ATRF "ATRFoff (t–τ)" is derived by dividing the voltage response "voff" obtained when the pulse current is turned off by the current value "Ip" of the pulse current.

$$ATRFoff\,(t-\tau) = voff/Ip \tag{4}$$

As described above, since the value "voff" differs depending on the certain time "t" from the timing "TBon", ATRFoff (t−τ) differs depending on the certain time "t" from the timing "TBon", more specifically, depending on the time "t−τ", and is a function whose variable is the time "t" or the time "t−τ". Since the specific time "Ts" between the timings "TBoff" and "Toff" corresponds to the time "t−τ", ATRFoff (t−τ) can be said to be a function whose variable is the specific time "Ts" between the timings "TBoff" and "Toff".

Figure 3:
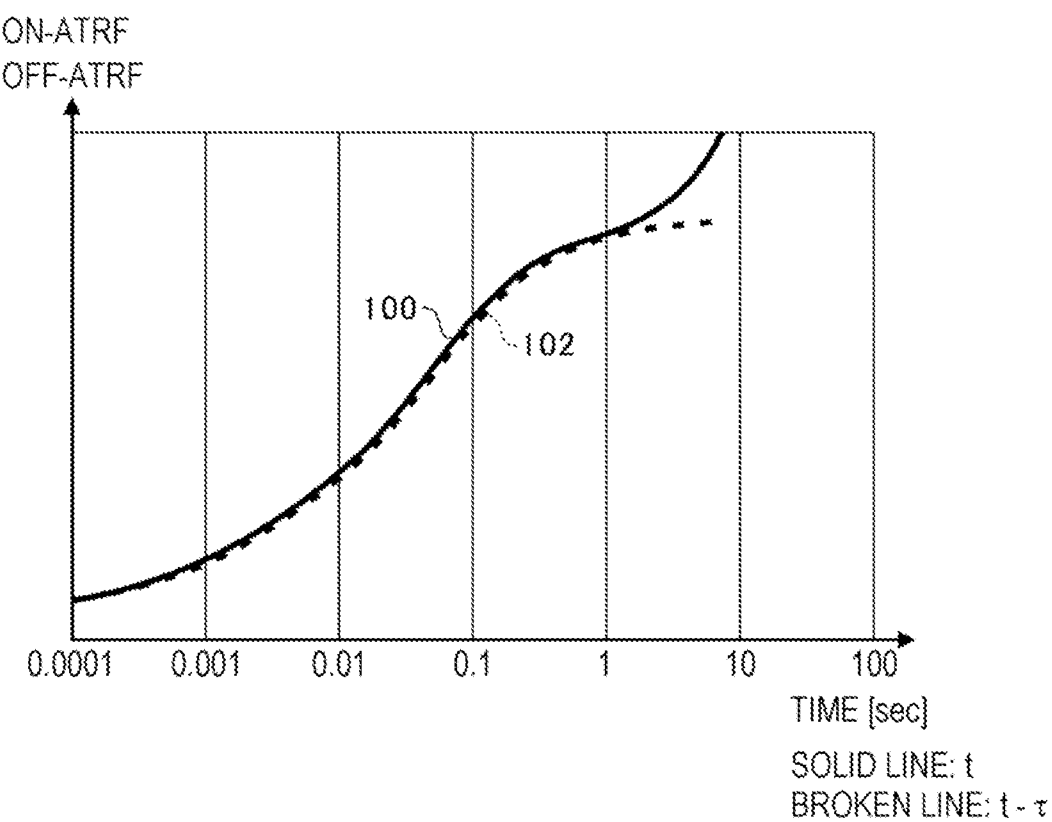
FIG. 3 is a diagram illustrating an example of a relationship between a specific time and an on-ATRF and an example of a relationship between a specific time and an off-ATRF when substantially no lithium is deposited.

FIG. 3 is a diagram illustrating an example of a relationship between a specific time and an on-ATRF and an example of a relationship between a specific time and an off-ATRF when substantially no lithium is deposited. In FIG. 3, the horizontal axis is the time "t" for a solid line 100 and the time "t−τ" for a broken line 102, that is, the specific time "Ts", and is represented in a logarithmic scale. The vertical axis is the on-ATRF or the off-ATRF. The solid line 100 indicates the relationship between the specific time and the on-ATRF. The broken line 102 indicates the relationship between the specific time and the off-ATRF.

As illustrated in FIG. 3, when substantially no lithium is deposited, the on-ATRF and the off-ATRF are almost the same when a common specific time is set.

Figure 4:
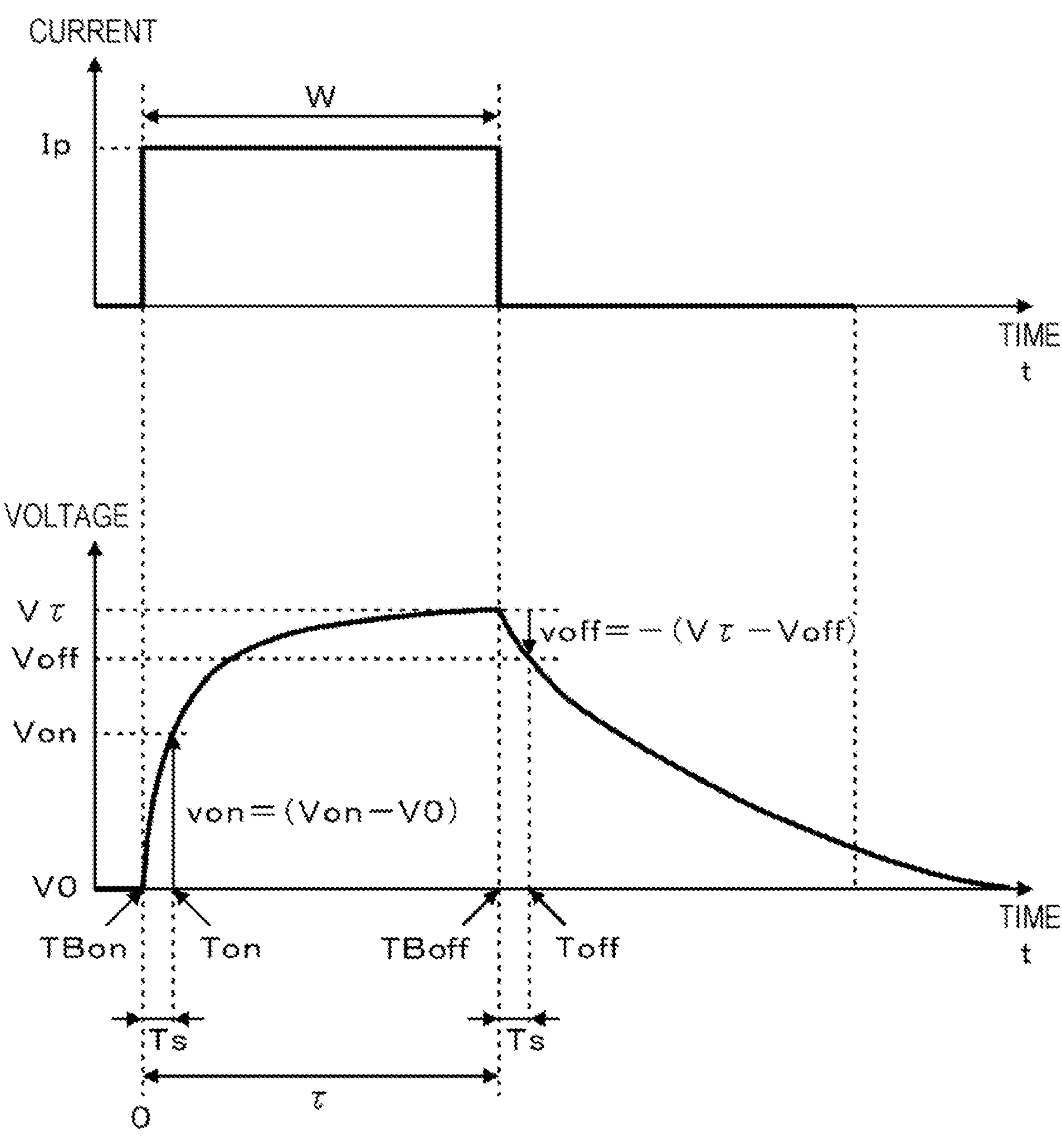
FIG. 4 is a diagram illustrating an example of a pulse current and a voltage response when a large amount of lithium is deposited.

FIG. 4 is a diagram illustrating an example of a pulse current and a voltage response when a large amount of lithium is deposited.

As illustrated in FIG. 4, when a large amount of lithium is deposited, as compared with FIG. 2, the time taken for the voltage to decrease in response to turning off of the pulse current is longer than the time taken for the voltage to increase in response to turning on of the pulse current.

Figures 5, 6:
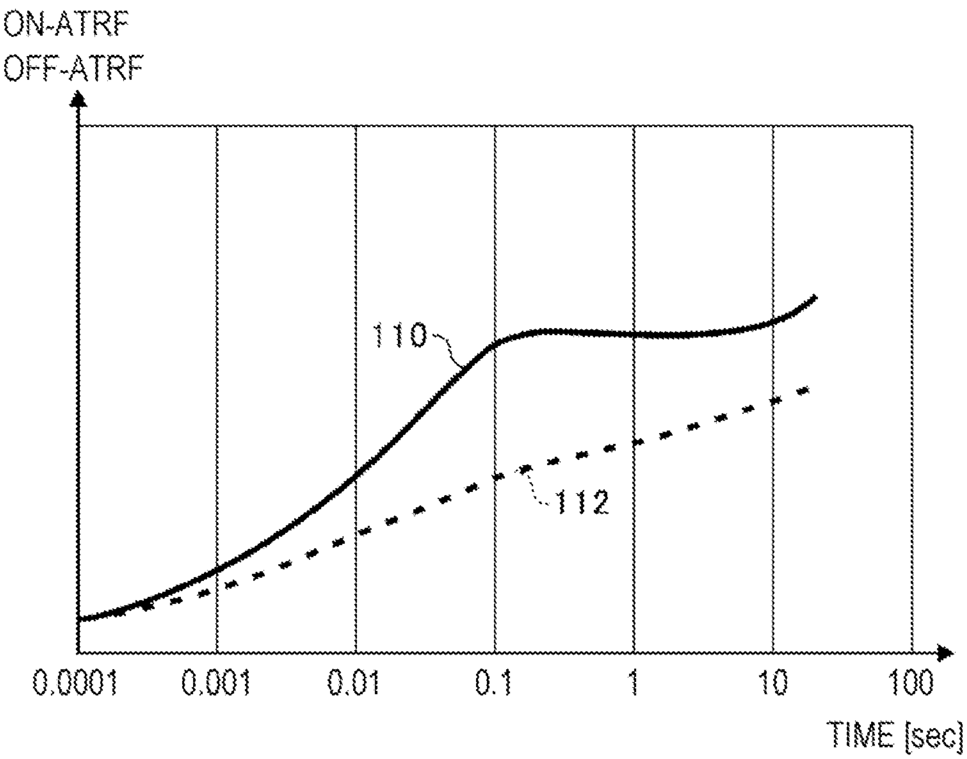
FIG. 5 is a diagram illustrating an example of a relationship between a specific time and an on-ATRF and an example of a relationship between a specific time and an off-ATRF when a large amount of lithium is deposited.
FIG. 6 is a diagram illustrating an example of a determination criterion table.

FIG. 5 is a diagram illustrating an example of a relationship between a specific time and an on-ATRF and an example of a relationship between a specific time and an off-ATRF when a large amount of lithium is deposited. A solid line 110 indicates the relationship between the specific time and the on-ATRF. A broken line 112 indicates the relationship between the specific time and the off-ATRF.

As illustrated in FIG. 5, when a large amount of lithium is deposited, as compared with FIG. 3, the on-ATRF and the off-ATRF diverge from each other when a common specific time is set.

Accordingly, the index deriver 72 illustrated in FIG. 1 derives an index indicating a comparison between the on-ATRF and the off-ATRF, based on the voltage response.

It is assumed that, as given in Equation (5) below, for example, the index described above is a resistance function ratio "RR(Ts)" indicating the ratio of the off-ATRF "ATRFoff(t−τ)" to the on-ATRF "ATFRon(t)". It is assumed that the specific time "Ts" for "ATRFoff(t−τ)" and the specific time "Ts" for "ATRFon(t)", which are used to derive the resistance function ratio "RR(Ts)", are the same.

$$RR(Ts) = ATRFoff(t)/ATRFon(t-\tau) \tag{5}$$

The index deriver 72 derives multiple indices having different specific times, for example, multiple resistance function ratios. For example, the index deriver 72 derives the resistance function ratios "RR(0.05)", "RR(0.089)", "RR (0.16)", "RR(0.28)", and "RR(0.5)" for which the specific time "Ts" is "0.05 sec", "0.089 sec", "0.16 sec", "0.28 sec", and "0.5 sec", respectively. The specific time is not limited to the times presented in the example above, and may be set to any time within a range not exceeding the pulse width of the pulse current. In addition, the number of resistance function ratios is not limited to five presented in the example above, and may be any number.

The determiner 74 determines the degree of deposition of lithium indicating the degree of degradation of the battery 10, based on an average value of the indices, for example, an average value of the resistance function ratios. The average value of the resistance function ratios may be hereinafter referred to as an average resistance function ratio.

The memory (or memories) 62 stores a determination criterion table in advance. The determination criterion table indicates determination criteria for determining the degree of deposition of lithium in the battery 10. The determiner 74 determines the degree of deposition of lithium in the battery 10 by using the determination criterion table and the average resistance function ratio.

FIG. 6 is a diagram illustrating an example of the determination criterion table. In the determination criterion table, a range for the average resistance function ratio is associated with a numerical value of an SLDT (State of Li Deposition Tendency). The SLDT represents the state of tendency of deposition of lithium and is an index for determining easiness of deposition of lithium. In the SLDT, for example, the degree of deposition of lithium in the battery 10 is divided into multiple stages. The larger the numerical value of the SLDT, the more the amount of lithium to be deposited is, that is, the higher the rate of using the charging current for the deposition reaction of lithium. The numerical value "0" of the SLDT means that it is considered that substantially no deposition of lithium occurs in response to application of a charging pulse current value of a certain magnitude.

As illustrated in FIG. 6, in the determination criterion table, a range for the average resistance function ratio and a numerical value of the SLDT are associated with each other such that the numerical value of the SLDT increases as the average resistance function ratio decreases. For example, when the average resistance function ratio "0.68" is obtained, the determiner 74 determines the SLDT "3" from the determination criterion table.

Further, the voltage response acquirer 70 applies multiple pulse currents having different current values to the battery 10 in stages to acquire voltage responses for the respective current values. For example, the voltage response acquirer 70 increases the current value of the pulse current in stages to obtain pulse currents of "0.1 C", "0.3 C", "0.5 C", and "1 C" in this order. A C-rate "C" indicates the ratio of the charge/discharge current value to the battery capacity (charge/discharge current value (A)/battery capacity (Ah)).

The index deriver 72 derives indices for the respective current values, based on the voltage responses for the respective current values. For example, the index deriver 72 derives the average resistance function ratio for "0.1 C", the average resistance function ratio for "0.3 C", the average resistance function ratio for "0.5 C", and the average resistance function ratio for "1 C".

The determiner 74 determines the degrees of deposition of lithium in the battery 10, based on the respective indices for the current values. For example, the determiner 74 determines the SLDT corresponding to the average resistance function ratio for "0.1 C", the SLDT corresponding to the average resistance function ratio for "0.3 C", the SLDT corresponding to the average resistance function ratio for "0.5 C", and the SLDT corresponding to the average resistance function ratio for "1 C". The SLDT for each current value may be hereinafter referred to as a current-value-specific SLDT, for convenience of description.

The determiner 74 combines the determined current-value-specific SLDTs to determine the SLDT of the degree of deposition of lithium in the battery as a final determination result. The SLDT as a final determination result may be hereinafter referred to as a total SLDT, for convenience of description. For example, the determiner 74 may set an average value of the current-value-specific SLDTs as the total SLDT. Alternatively, the determiner 74 may set a median value of the current-value-specific SLDTs as the total SLDT.

In the battery diagnosis apparatus 12 according to the present embodiment, the degree of deposition of lithium in the battery is determined based on an index indicating a comparison between an on-ATRF and an off-ATRF. As a result, the degree of deposition of lithium can be easily recognized.

The resistance function ratio derived based on the voltage response depends on the temperature of the battery 10. For example, when the temperature of the battery 10 is relatively low, the resistance function ratio is lower than that when the temperature of the battery 10 is relatively high.

Accordingly, the determination criterion setter 76 illustrated in FIG. 1 acquires the temperature of the battery 10 from the temperature sensor 44 before the pulse current is applied to the battery 10. The determination criterion setter 76 determines a determination criterion for determining the degree of deposition of lithium in the battery 10, based on the acquired temperature of the battery 10.

For example, the memory (or memories) 62 stores, in advance, determination criterion tables each for a temperature of the battery 10. The determination criterion setter 76 selects a determination criterion table corresponding to the acquired temperature of the battery 10 from among the determination criterion tables.

The determiner 74 compares the determined determination criterion with the index indicating the comparison between the on-ATRF and the off-ATRF to determine the degree of deposition of lithium in the battery. For example, the determiner 74 uses the determination criterion table selected by the determination criterion setter 76 and the average resistance function ratio derived by the index deriver 72 to determine the SLDT.

Since an appropriate determination criterion is determined based on the temperature of the battery 10, the battery diagnosis apparatus 12 can more accurately determine the degree of deposition of lithium.

The resistance function ratio derived based on the voltage response changes depending on the SOC of the battery. Accordingly, the SOC of the battery is set to be approximately the same every time a diagnosis is made.

To be more specific, if the SOC of the battery 10 is out of a preset predetermined range before the pulse current is applied to the battery 10, the SOC adjuster 78 causes the SOC adjustment device 46 to adjust the SOC of the battery 10 so that the SOC of the battery 10 falls within the predetermined range. The predetermined range is, for example but not limited to, a range of predetermined errors including an SOC of 50%. The predetermined range may be any range.

For example, if the SOC of the battery 10 is greater than the upper limit of the predetermined range, the SOC adjuster 78 causes the SOC adjustment device 46 to serve as a load and transfers the electric power of the battery 10 to the SOC adjustment device 46 to reduce the SOC of the battery 10. If the SOC of the battery 10 is lower than the lower limit of the predetermined range, the SOC adjuster 78 causes the SOC adjustment device 46 to serve as a power source and transfers the electric power of the SOC adjustment device 46 to the battery 10 to increase the SOC of the battery 10.

Since the SOC of the battery 10 is intentionally adjusted before a diagnosis is made, the battery diagnosis apparatus 12 can more accurately determine the degree of deposition of lithium.

Figure 7:
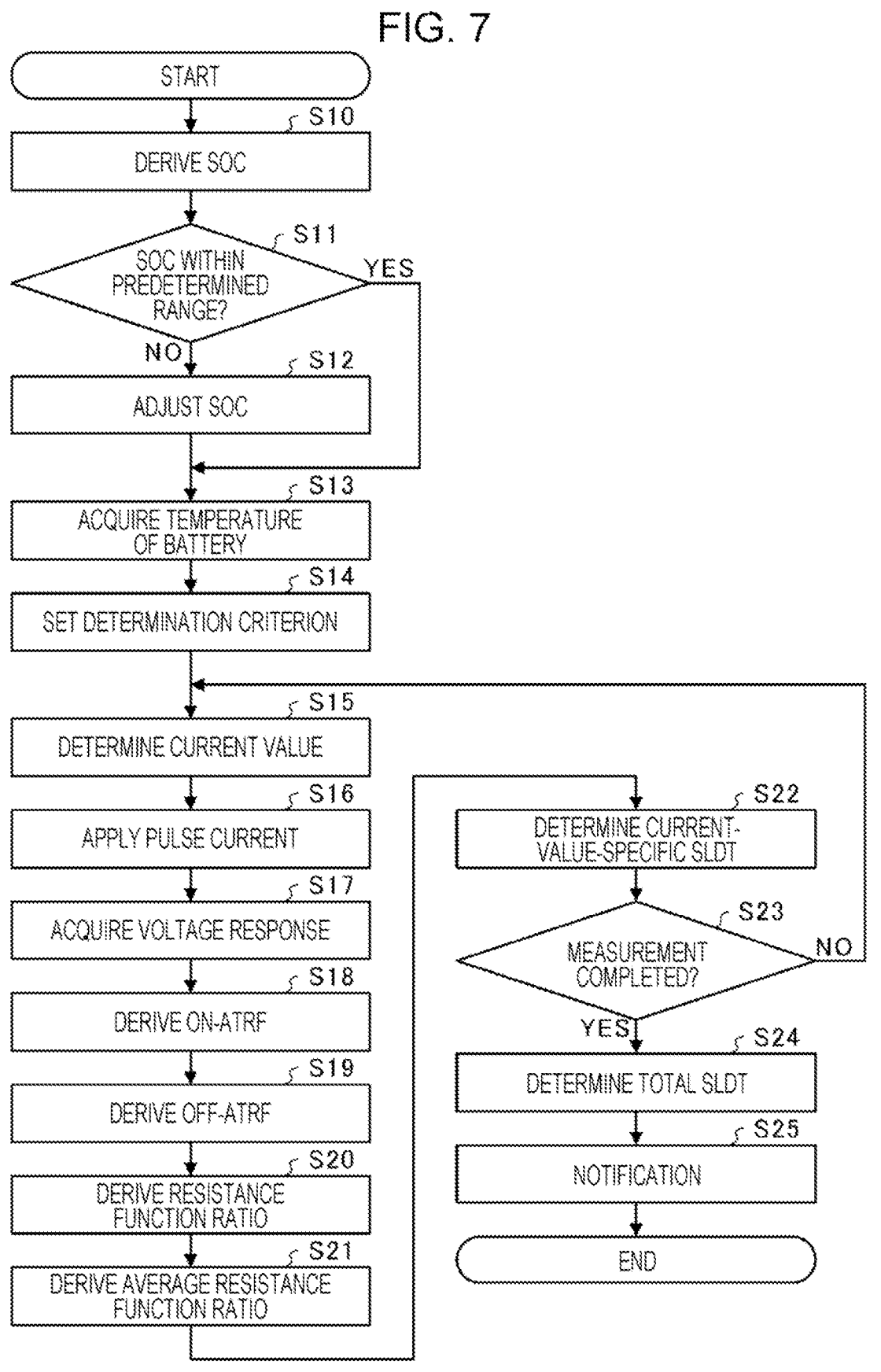

FIG. 7 is a flowchart illustrating a process flow in the battery diagnosis apparatus 12. When the battery diagnosis apparatus 12 is coupled to the battery 10 and receives an input operation for giving an instruction to start a diagnosis, a series of processing operations illustrated in FIG. 12 is started.

First, the SOC adjuster 78 derives the present SOC of the battery 10 (S10). For example, the SOC adjuster 78 acquires the present voltage from the voltage sensor 42, and estimates the present SOC of the battery 10 from the acquired present voltage.

Then, the SOC adjuster 78 determines whether the present SOC is within a predetermined range (S11). If the present SOC is out of the predetermined range (NO in S11), the SOC adjuster 78 causes the SOC adjustment device 46 to intentionally adjust the SOC so that the SOC of the battery falls within the predetermined range (S12). Then, the SOC adjustment device 46 proceeds to the processing of step S13. If the present SOC is within the predetermined range (YES in S11), the SOC adjustment device 46 proceeds directly to the processing of step S13.

In step S13, the determination criterion setter 76 acquires the temperature of the battery 10 from the temperature sensor 44 (S13). The determination criterion setter 76 sets a determination criterion based on the acquired temperature of the battery (S14).

Then, the voltage response acquirer 70 determines the current value of the pulse current to be applied from among candidate current values (S15). The voltage response acquirer 70 causes the current source 40 to apply a pulse current having the determined voltage value to the battery (S16). The voltage response acquirer 70 acquires a voltage response detected by the voltage sensor 42 in parallel with the application of the pulse current (S17). The voltage response acquirer 70 may store the acquired voltage response in the memory (or memories) 62 or the storage device 52.

Then, the index deriver 72 derives an on-ATRE based on the voltage response obtained when the pulse current is turned on (S18). The index deriver 72 derives an off-ATRF based on the voltage response obtained when the pulse current is turned off (S19). At this time, the index deriver 72 may check whether the on-ATRF and the off-ATRF are obvious abnormal values. If it is determined that the on-ATRF or the off-ATRF is an abnormal value, the derivation of the resistance function ratio, the determination of the current-value-specific SLDT, and the like may be omitted, and the on-ATRF or the off-ATRF that is the abnormal value may be excluded from the target from which the total SLDT is to be derived.

Then, the index deriver 72 divides the off-ATRF by the on-ATRF to derive a resistance function ratio (S20). At this time, the index deriver 72 uses the off-ATRF and the on-ATRF having a common specific time to derive the resistance function ratio at the specific time. Further, the index deriver 72 derives resistance function ratios for multiple specific times to derive multiple resistance function ratios. Then, the index deriver 72 averages the multiple resistance function ratios by the number of resistance function ratios to derive an average resistance function ratio (S21).

Then, the determiner 74 determines a current-value-specific SLDT for the present current value determined in step S15, based on the determination criterion set in step S14 and the average resistance function ratio derived in step S21 (S22). The determiner 74 may store the determined current-value-specific SLDT in the memory (or memories) 62 or the storage device 52.

Then, the determiner 74 determines whether a measurement completion condition is satisfied (S23). For example, if the determination of the current-value-specific SLDT is completed for all the candidate current values, the determiner 74 determines that the measurement completion condition is satisfied. The measurement completion condition is not limited to this example, and any condition may be set.

If the measurement completion condition is not satisfied (NO in S23), the determiner 74 returns to step S15, and determines any current value from among the candidate current values for which the determination of the current-value-specific SLDT is not completed (S15). Then, the battery diagnosis apparatus 12 executes the processing of step S16 and subsequent steps again.

If the measurement completion condition is satisfied (YES in S23), the determiner 74 combines the current-value-specific SLDTs determined for the respective current values and determines a total SLDT (S24). The determiner 74 provides notification of the total SLDT as a diagnosis result (S25). Then, the series of processing operations ends. For example, the determiner 74 causes the display device of the input/output device to display the total SLDT as a diagnosis result. The method for providing notification is not limited to this example. Any method that allows the user to appropriately recognize the diagnosis result may be used.

As described above, in the battery diagnosis apparatus 12 according to the present embodiment, the degree of deposition of lithium in the battery 10 is determined based on an index indicating a comparison between an on-ATRF obtained when the pulse current is turned on and an off-ATRE obtained when the pulse current is turned off. The above determination does not involve disassembling the battery 10, and thus the battery diagnosis apparatus 12 according to the present embodiment can easily diagnose deposition of lithium indicating degradation of the battery 10.

The index indicating the comparison between the on-ATRF and the off-ATRF changes according to the deposition of lithium in the lithium ion battery. The battery diagnosis apparatus 12 according to the present embodiment is configured to perform a diagnosis by using an index relating to the deposition of lithium. Thus, the degree of deposition of lithium can be clearly indicated.

In addition, the battery diagnosis apparatus 12 according to the present embodiment can diagnose the battery 10 in a non-destructive manner, and can save the labor and cost for disassembling the battery 10. Further, for example, the battery diagnosis apparatus 12 according to the present embodiment can easily reuse the battery 10 in which the degree of deposition of lithium is low.

In the battery diagnosis apparatus 12 according to the present embodiment, furthermore, since the time taken to turn on and off the pulse current is short, the time taken to diagnose the battery 10 is short. As a result, a diagnosis result can be obtained early.

In the battery diagnosis apparatus 12 according to the present embodiment, furthermore, a resistance function ratio indicating the ratio of the off-ATRF to the on-ATRF is used as the index indicating the comparison between the on-ATRF and the off-ATRF. Thus, the battery diagnosis apparatus 12 according to the present embodiment can easily and accurately diagnose the deposition of lithium in the battery 10.

In the battery diagnosis apparatus 12 according to the present embodiment, the index indicates a comparison between an on-ATRF at a timing at which a specific time has elapsed from the timing of a rising edge of the voltage in response to turning on of the pulse current and an off-ATRF at a timing at which a specific time has elapsed from the timing of a falling edge of the voltage in response to turning off of the pulse current. That is, the battery diagnosis apparatus 12 according to the present embodiment compares the on-ATRF and the off-ATRF at a timing at which the specific time for the on-ATRF and the specific time for the off-ATRF are substantially the same. Thus, the battery diagnosis apparatus 12 according to the present embodiment can accurately determine the degree of deposition of lithium in the battery 10.

In the battery diagnosis apparatus 12 according to the present embodiment, furthermore, the degree of deposition of lithium in the battery 10 is determined based on an average value of indices having different specific times. Thus, the battery diagnosis apparatus 12 according to the present embodiment can reduce an error between the indices and can more accurately determine the degree of deposition of lithium in the battery 10.

In the battery diagnosis apparatus 12 according to the present embodiment, furthermore, the degree of deposition of lithium in the battery 10 is determined based on respective indices for current values of the pulse current. Thus, the battery diagnosis apparatus 12 according to the present embodiment can more accurately determine the degree of deposition of lithium in the battery 10.

In the battery diagnosis apparatus 12 according to the present embodiment, furthermore, the SOC is adjusted so that the SOC falls within a predetermined range before application of the pulse current. Thus, the battery diagnosis apparatus 12 according to the present embodiment can more accurately determine the degree of deposition of lithium in the battery 10.

In the battery diagnosis apparatus 12 according to the present embodiment, furthermore, a determination criterion is determined based on the temperature of the battery before application of the pulse current. Thus, the battery diagnosis apparatus 12 according to the present embodiment can more accurately determine the degree of deposition of lithium in the battery 10.

In the embodiment described above, the resistance function ratio, which is the ratio of the off-ATRF to the on-ATRF, is used as the index indicating the comparison between the on-ATRF and the off-ATRF. However, the index is not limited to the resistance function ratio. For example, Equations (2) and (4) in the embodiment described above have a common feature in that the voltage response is divided by the pulse current Ip. In consideration of this, the degree of deposition of lithium in the battery 10 may be determined based on, instead of the resistance function ratio, a voltage ratio that is the ratio of the voltage response "voff" obtained when the pulse current is turned off to the voltage response "von" obtained when the pulse current is turned on.

As described with reference to FIG. 5, when a large amount of lithium is deposited, the on-ATRE and the off-ATRF diverge from each other. This divergence may be represented by, instead of the resistance function ratio, an absolute value of a difference between the on-ATRF and the off-ATRF. That is, the index indicating the comparison between the on-ATRF and the off-ATRF may be the absolute value of the difference between the on-ATRF and the off-ATRF when a common specific time is set.

However, when the absolute value of the difference between the on-ATRF and the off-ATRF is used as an index, the error caused by a change in the on-ATRF or the off-ATRF may be larger than that when the resistance function ratio is used. That is, the mode in which the resistance function ratio is used provides more accurate determination than the mode in which the absolute value of the difference is used.

In the embodiment described above, furthermore, multiple resistance function ratios are averaged to derive an average resistance function ratio for one current value. The index deriver 72 simply derives at least one resistance function ratio for one current value, and the derivation of an average resistance function ratio may be omitted. In this case, the index deriver 72 may determine a current-value-specific SLDT from one resistance function ratio and a determination criterion table.

In the embodiment described above, furthermore, an average resistance function ratio is derived for multiple current values. However, the index deriver 72 may derive an average resistance function ratio or a resistance function ratio for one current value.

In the embodiment described above, furthermore, the SOC of the battery 10 is adjusted before application of the pulse current. However, respective determination criterion tables corresponding to multiple SOCs may be prepared to omit the adjustment of the SOC.

Although an embodiment of the present invention has been described with reference to the accompanying drawings, it is needless to say that the present invention is not limited to the embodiment. It will be apparent to those skilled in the art that various changes and modifications can be made without departing from the scope as defined by the appended claims and that such changes and modifications also fall within the technical scope of the present invention.

REFERENCE SIGNS LIST

10 battery
12 battery diagnosis apparatus
40 current source
42 voltage sensor
46 SOC adjustment device
54 control device
60 processor
62 memory
70 voltage response acquirer
72 index deriver
74 determiner
76 determination criterion setter
78 SOC adjuster

The invention claimed is:

1. A battery diagnosis apparatus for diagnosing a state of a battery, the battery diagnosis apparatus comprising:
- a current source configured to apply a pulse current to the battery;
- a voltage sensor configured to detect a voltage between terminals of the battery;
- a temperature sensor configured to detect a temperature of the battery;
- an SOC adjustment device configured to adjust an SOC of the battery; and
- a control device, wherein
- the control device comprises:
  - one or more processors; and
  - one or more memories coupled to the one or more processors, and
- the one or more processors are configured to execute processing comprising:
  - deriving a present SOC of the battery before the pulse current is applied to the battery;
  - when the present SOC of the battery is greater than an upper limit of a predetermined range before the pulse current is applied to the battery, causing the SOC adjustment device to receive electric power from the battery to reduce the SOC of the battery, and when the present SOC of the battery is lower than a lower limit of the predetermined range before the pulse current is applied to the battery, causing the SOC adjustment device to supply electric power to the battery to increase the SOC of the battery;
  - acquiring the temperature of the battery before the pulse current is applied to the battery;
  - determining a determination criterion for determining a degree of deposition of lithium in the battery, based on the temperature of the battery before the pulse current is applied to the battery;
  - applying a plurality of the pulse currents having different current values to the battery in stages to acquire respective voltage responses corresponding to the current values;
  - deriving, from the respective voltage responses, respective indices corresponding to the current values, each index indicating a comparison between an on-ATRF and an off-ATRF, the on-ATRF being an apparent transient resistance function of the battery when a corresponding one of the pulse currents is turned on, the off-ATRF being an apparent transient resistance function of the battery when the corresponding one of the pulse currents is turned off, the on-ATRF being at a timing at which a specific time has elapsed from a timing of a rising edge of a voltage in response to turning on of the corresponding one of the pulse currents, the off-ATRF being at a timing at which the specific time has elapsed from a timing of a falling edge of the voltage in response to turning off of the corresponding one of the pulse currents; and
  - comparing the determined determination criterion with the respective indices corresponding to the current values to determine the degree of deposition of lithium in the battery, based on the respective indices corresponding to the current values.

2. The battery diagnosis apparatus according to claim 1, wherein each index is a resistance function ratio indicating a ratio of the off-ATRF to the on-ATRF.

3. The battery diagnosis apparatus according to claim 1, wherein
- in the deriving of the indices, the one or more processors are configured to execute processing comprising, for each of the current values, deriving a plurality of the indices having different specific times, and
- in the determining of the degree of deposition of lithium in the battery, the one or more processors are configured to execute processing comprising determining the degree of deposition of lithium in the battery, based on respective average values of the indices for the current values.

4. The battery diagnosis apparatus according to claim 2, wherein each index indicates a comparison between the on-ATRF at a timing at which a specific time has elapsed from a timing of a rising edge of a voltage in response to turning on of a corresponding one of the pulse currents and the off-ATRF at a timing at which the specific time has elapsed from a timing of a falling edge of the voltage in response to turning off of the corresponding one of the pulse currents.

5. The battery diagnosis apparatus according to claim 4, wherein in the deriving of the indices, the one or more processors are configured to execute processing comprising, for each of the current values, deriving a plurality of the indices having different specific times, and in the determining of the degree of deposition of lithium in the battery, the one or more processors are configured to execute processing comprising determining the degree of deposition of lithium in the battery, based on respective average values of the indices for the current values.

6. The battery diagnosis apparatus according to claim 1, wherein the one or more memories store a plurality of determination criterion tables corresponding to respective temperatures of the battery, and the one or more processors are further configured to execute processing comprising selecting one of the determination criterion tables based on the temperature of the battery.

7. The battery diagnosis apparatus according to claim 1, wherein the one or more processors are further configured to execute processing comprising:

after deriving the on-ATRF and the off-ATRF, determining whether the on-ATRF or the off-ATRF is an abnormal value; and when the on-ATRF or the off-ATRF is determined to be the abnormal value, omitting derivation of the index and determination of a current-value-specific SLDT indicating the degree of deposition of lithium in the battery, and excluding the abnormal value from a target from which a total SLDT indicating the degree of deposition of lithium in the battery is to be derived.

8. The battery diagnosis apparatus according to claim 1, wherein the one or more processors are configured to execute processing comprising:

after determining the degree of deposition of lithium in the battery for one of the current values, determining whether a measurement completion condition is satisfied; and when the measurement completion condition is not satisfied, determining another current value from among candidate current values for which determination of a current-value-specific SLDT indicating the degree of deposition of lithium in the battery is not completed, and causing the current source to apply a pulse current having the another current value to the battery.

* * * * *